US006891199B2

(12) United States Patent
Baur et al.

(10) Patent No.: US 6,891,199 B2
(45) Date of Patent: May 10, 2005

(54) RADIATION-EMITTING SEMICONDUCTOR CHIP AND LIGHT-EMITTING DIODE

(75) Inventors: Johannes Baur, Deuerling (DE); Dominik Eisert, Regensburg (DE); Michael Fehrer, Bad Abbach (DE); Berthold Hahn, Hemau (DE); Volker Harle, Laaber (DE); Ulrich Jacob, Regensburg (DE); Werner Plass, Regensburg (DE); Uwe Strauss, Bad Abbach (DE); Johannes Völkl, Erlangen (DE); Ulrich Zehnder, Regensburg (DE)

(73) Assignee: Osram GmbH (DE)

( * ) Notice: Subject to any disclaimer, the term of this patent is extended or adjusted under 35 U.S.C. 154(b) by 0 days.

(21) Appl. No.: 10/343,851

(22) PCT Filed: Jul. 24, 2001

(86) PCT No.: PCT/DE01/02801

§ 371 (c)(1),
(2), (4) Date: Sep. 11, 2003

(87) PCT Pub. No.: WO02/15287

PCT Pub. Date: Feb. 21, 2002

(65) Prior Publication Data

US 2004/0056263 A1 Mar. 25, 2004

(30) Foreign Application Priority Data

Aug. 11, 2000 (DE) .......................... 100 39 433

(51) Int. Cl.⁷ .............................................. H01L 29/16
(52) U.S. Cl. ............................................ 257/82; 257/84
(58) Field of Search ........................... 257/82, 83, 84, 257/79

(56) References Cited

U.S. PATENT DOCUMENTS

| 3,576,586 | A | | 4/1971 | Ross |
| 4,267,486 | A | | 5/1981 | Thillays |
| 5,523,589 | A | | 6/1996 | Edmond et al. |
| 5,548,131 | A | * | 8/1996 | Tokunaga et al. ............. 257/64 |
| 5,631,474 | A | | 5/1997 | Saitoh |
| 5,753,966 | A | | 5/1998 | Morita et al. |
| 5,936,264 | A | | 8/1999 | Ishinaga |
| 5,990,497 | A | | 11/1999 | Kamakura et al. |
| 6,495,861 | B1 | * | 12/2002 | Ishinaga ...................... 257/99 |
| 6,696,704 | B1 | * | 2/2004 | Maeda et al. ................. 257/98 |
| 6,724,068 | B2 | * | 4/2004 | Matsuyama ................. 257/618 |
| 2002/0028527 | A1 | * | 3/2002 | Maeda et al. ................. 438/29 |

FOREIGN PATENT DOCUMENTS

| CN | 1158017 A | 8/1997 |
| CN | 1166890 A | 12/1997 |
| DE | 2340425 | 2/1974 |
| DE | 2813930 | 10/1979 |
| EP | 59 004088 | 1/1984 |

(Continued)

OTHER PUBLICATIONS

Dyment, JC., "Hermite–Gaussian Mode Patterns in GaAs Junction Lasers", *Appl. Phys. Lett.*, vol. 10, No. 3, pp. 84–86; 1967.

(Continued)

*Primary Examiner*—S. V. Clark
(74) *Attorney, Agent, or Firm*—Fish & Richardson P.C.

(57) ABSTRACT

Proposed for high-performance light-emitting diodes are semiconductor chips (1) whose longitudinal sides are substantially longer than their transverse sides. Light extraction can be substantially improved in this manner.

20 Claims, 3 Drawing Sheets

FOREIGN PATENT DOCUMENTS

| | | |
|---|---|---|
| EP | 62 093985 | 4/1987 |
| EP | 0 544512 | 6/1993 |
| EP | 05 226781 | 9/1993 |
| EP | 06 224469 | 8/1994 |
| EP | 08 102549 | 4/1996 |
| EP | 08 288543 | 11/1996 |
| EP | 0 905797 | 3/1999 |
| EP | 11 317546 | 11/1999 |
| EP | 0 961328 | 12/1999 |
| JP | 49 40092 | 4/1974 |
| JP | 49 90494 | 8/1974 |
| JP | 5-327012 | 12/1993 |
| JP | 10326910 | 12/1998 ........... H01L/33/00 |

OTHER PUBLICATIONS

Song, JL., "Efficiency Improvement in Light–Emitting Diodes Based on Geometrically Deformed Chips", *SPIE Conf. on Light–Emitting Diodes: Manufact. and Applic. III* pp. 237–248, San Jose, 1999.

Carr, W. N. "Photometric Figures of Merit for Semiconductor Luminescent Sources Operating in Spontaneous Mode", *Infrared Physics,* Vol. 6, pp. 1–19 (1996).

\* cited by examiner

RADIATION-EMITTING SEMICONDUCTOR CHIP AND LIGHT-EMITTING DIODE

FIELD OF THE INVENTION

The invention concerns a radiation-emitting semiconductor chip comprising an active layer that includes a radiation-producing region, and comprising transverse sides and longitudinal sides that delimit the semiconductor laterally in a direction of extent of the active region. The invention further concerns a light-emitting diode (LED) fashioned with such a semiconductor chip.

BACKGROUND OF THE INVENTION

A semiconductor chip of this kind is known from the article by Song Jae Lee and Seok Won Song, "Efficiency Improvement in Light-Emitting Diodes Based on Geometrically Deformed Chips," SPIE Conference on Light-Emitting Diodes: Research, Manufacturing and Applications III, San Jose, Calif., January 1999, pages 237–248. The semiconductor body of a semiconductor chip described therein comprises a bottom cover layer, an active region and a top cover layer. In one embodiment, the semiconductor chip is realized in the shape of a prism with a lozenge as its base. With such a lozenge-shaped plan, the beams of light emanating from the active region strike a lateral surface, at least after some total reflections from the lateral surfaces, at an angle that is smaller than the critical angle for total reflection. The light output is limited substantially by absorption in the semiconductor chip.

Problems arise with the known semiconductor chips when they are used for high luminous efficiencies. High luminous efficiencies presuppose high electrical currents through the semiconductor chip. In this situation, there is a nonlinear relationship between the luminous efficiency and the required current intensity. That is, the required current intensity increases disproportionately with the luminous efficiency. The heat generated per surface unit of cross-sectional area therefore increases disproportionately with increasing luminous efficiency of the semiconductor chip. To limit thermal loading, it is therefore necessary to reduce the current density by increasing the cross-sectional area. Thus, semiconductor chips of high luminous efficiency usually have particularly large cross-sectional areas.

However, assuming that the thickness of the semiconductor chip is unchanged, this causes the lateral surfaces of the semiconductor chip to appear to be at a smaller solid angle when viewed from a light-generating light spot in the active region. Thus, in percentage terms, fewer beams of light strike the lateral surfaces of the semiconductor chip directly. Of course, this can theoretically be corrected by scaling the thickness of the semiconductor chip to its cross-sectional dimensions, which would again yield large lateral surfaces. For reasons of process technology, this is difficult to do, however. In addition, substrates, for example, can be obtained only in specific, predetermined layer thicknesses.

BRIEF SUMMARY OF THE INVENTION

Proceeding from this state of the art, an object of the invention is to provide a semiconductor chip suitable for high radiation efficiencies and offering improved extraction of the radiation generated in the semiconductor chip. It is also an object of the invention to devise an optical component with improved radiation output.

This object is achieved according to the invention by the fact that at least one longitudinal side of the semiconductor chip, serving as an extraction surface, is longer in the direction of extent of the active region than a transverse side.

To obtain a suitable semiconductor chip for high luminous efficiencies, it is first necessary to select the lateral cross section as so large that the lost heat generated can be dissipated. The term "lateral cross section" is to be understood as the area of a cross section extending longitudinally to the active region. Especially in a material of low thermal conductivity, the lateral cross section is to be selected as so large that the lost heat produced in the active region can be dissipated. By lengthening the longitudinal sides relative to the transverse sides, one can influence the ratio of the cross-sectional area to the sum of the lateral areas. In particular, the ratio of the cross-sectional area to the sum of the lateral areas can be reduced by lengthening the longitudinal sides relative to the transverse sides. This makes the ratio of the cross-sectional area to the sum of the lateral areas much more favorable for light extraction. As a result, the longitudinal sides, when viewed from the active region outward, appear to be at a larger solid angle than in a case where the longitudinal sides and the transverse sides are lengthened to an equal extent. The percentage of the radiation that strikes a lateral surface directly is therefore higher. The optical paths taken by the radiation in the semiconductor chip therefore become shorter. The likelihood that some of the radiation will be absorbed en route to a lateral surface is therefore smaller.

For these reasons, given equal cross-sectional area, a semiconductor chip whose longitudinal sides are longer than its transverse sides will have better radiation output than a semiconductor chip whose sides are of equal length.

In a preferred embodiment, the active region is located in an active layer arranged on a radioparent substrate that tapers to a base surface of the substrate disposed opposite the active layer.

Since the radiation emanating from the active layer and passing through the radioparent substrate generally strikes the inclined longitudinal sides at an angle that is smaller than the angle of total reflection, increasing the solid angle at which the lateral surfaces appear to be when viewed from the active layer results in especially high light output.

Further advantageous embodiments of the invention are the subject matter of the dependent claims.

BRIEF DESCRIPTION OF THE DRAWINGS

The invention is described in detail below with reference to the appended drawing, wherein.

Figure 1A:
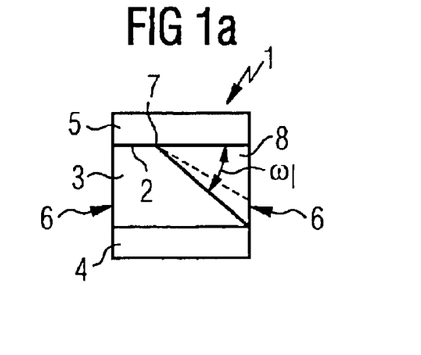
FIGS. 1a and b are schematic representations of a cross section and a longitudinal section through a semiconductor chip according to the invention, FIGS. 2a and b are a schematic representation of a cross section through an LED and a plan view of an LED equipped with the semiconductor chip of FIGS. 1a and b, FIGS. 3a and b are a schematic representation of a cross section through a further LED and a plan view of a further LED provided with the semiconductor chip of FIGS. 1a and b.

FIG. 1a shows a cross section through a semiconductor chip 1 comprising an active layer 2. The active layer 2 is generally a current-conducting layer or layer sequence that contains a radiation-emitting region and is preferably within a multilayer structure. Active layer 2 is arranged on a substrate 3 that is transparent to the radiation from active layer 2. Also present are a bottom cover layer 4 and a top cover layer 5, which serve, for example, as contact layers. The semiconductor chip 1 further comprises longitudinal sides 6.

The substrate is generally surrounded by a medium that has a lower index of refraction than the substrate. Due to total reflection on the lateral surfaces of the substrate, for example longitudinal sides 6 in FIG. 1a, the only light beams that are able to exit the substrate through the lateral surfaces are those striking the lateral surfaces at an angle that is smaller than the critical angle of total reflection for the transition from the substrate to the adjacent medium. This angle will also be referred to briefly hereinbelow as the total reflection angle.

To be extracted from a lateral surface of the substrate, therefore, the light beams emanating from a light spot must travel within a light escape cone whose center axis is the surface normal of the lateral surface of the substrate that passes through the light spot. The flare angle of the escape cone is twice as large as the total reflection angle. Should the light beams emanating from the light spot pass out of this escape cone, they are totally reflected from the relevant lateral surface of the substrate.

In the case depicted in FIG. 1a, the region of longitudinal sides 6 constituted by substrate 3, when viewed from a radiation-emitting light spot 7 in active layer 2, appears to be at a solid angle $\omega_1$. This solid angle $\omega_1$ is so large that all light beams emanating from light point 7 and passing through the portion of escape cone 8 located in substrate 3 strike longitudinal side 6 and are extracted.

Figure 1B:
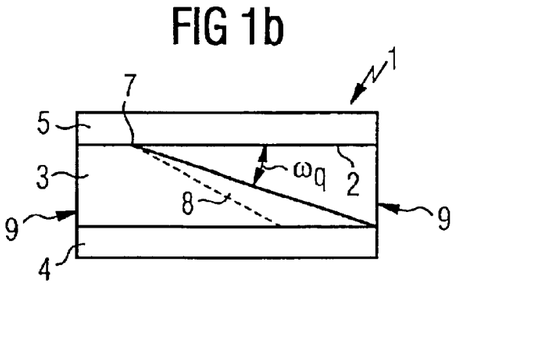

A semiconductor chip 1 is shown in longitudinal section in FIG. 1b. Viewed from light spot 7, the regions of transverse sides 9 constituted by substrate 3 appear to be at a solid angle $\omega_q$. Solid angle $\omega_q$ is much smaller than solid angle $\omega_1$ at which longitudinal sides 6 appear to be when viewed from light spot 7. In particular, $\omega_q$ is so small so that some of the extractable light beams passing through the portion of the escape cone located in the substrate strike bottom cover layer 4 and are not extracted.

It is, of course, theoretically possible to increase the thickness of the substrate 3 to such an extent that all the light beams in escape cone 8 strike transverse sides 9. For practical reasons, however, this is feasible to only a limited extent. Standard commercial substrates 3 can be obtained only in specific, predetermined thicknesses. Thus, the thickness of substrate 3 cannot be chosen arbitrarily. It is therefore advantageous if the longitudinal sides 6 are selected to be as long as possible. Furthermore, the transverse sides 9 should be selected to be at least so short that the light beams in the escape cone 8 that emanate from the light spot farthest from a longitudinal side 6 strike that longitudinal side 6 directly. Increasing the longitudinal sides 6 in comparison to the transverse sides 9 produces a favorable ratio of lateral areas to active area. The term "active area" in this context is to be understood as the area of the active layer 2. Assuming that the active area remains the same, the ratio of lateral areas to active area is higher when the lengths of longitudinal sides 6 and transverse sides 9 are unequal than when the lengths of longitudinal sides 6 and transverse sides 9 are equal.

The fact that the light beams passing through the portion of escape cone 8 located in the substrate can strike longitudinal sides 6 unimpeded and the favorable ratio of lateral areas to active area causes the semiconductor chip 1 to be distinguished by a high current-carrying capacity while simultaneously offering good radiation extraction.

Figure 2A:
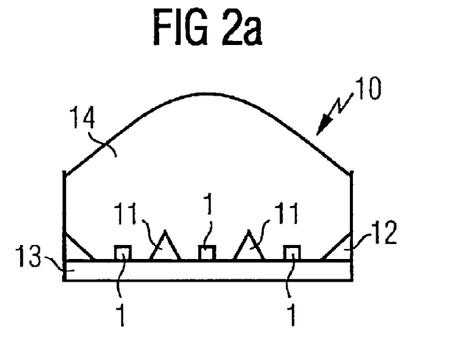
Figure 2B:
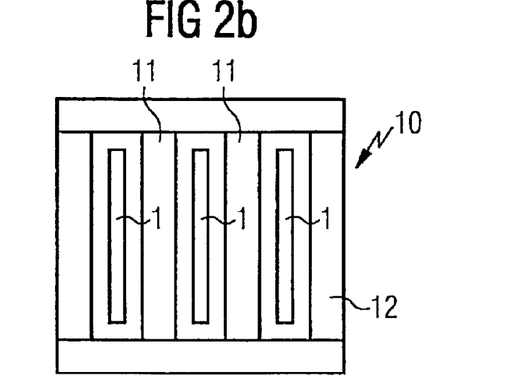

FIGS. 2a and b are a cross section and a plan view, respectively, of an LED component 10 equipped with the semiconductor chip 1. The elongated semiconductor chips 1, in which the ratio of the lengths of the longitudinal sides to the lengths of the transverse sides is at least 10:1, are arranged parallel to one another, resulting in a roughly square base surface for the LED 10 as a whole. Partitions 11 are arranged between the semiconductor chips 1. The semiconductor chips 1 and the partitions 11 are surrounded by a bezel 12. Both the semiconductor chips 1 and the partitions 11 and bezel 12 are arranged on a common support 13 and are covered by a lens body 14 made, for example, of plastic.

Partitions 11 and bezel 12 serve to deflect away from carrier 13 and into lens body 14 the radiation emitted sideward by semiconductor chips 1. In particular, partitions 11 prevent the radiation emitted by one of the semiconductor chips 1 from being absorbed by one of the adjacent semiconductor chips 1.

Figure 3A:
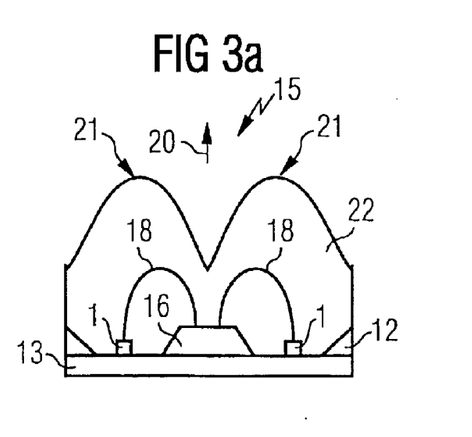
Figure 3B:
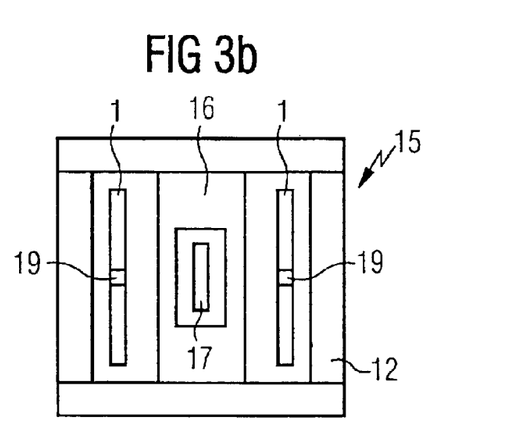

FIGS. 3a and b show a further exemplary embodiment of an LED component 5, in which the central semiconductor chip is replaced by a broad partition 16 having on its top face a contact surface 17 for bonding wires 18. The bonding wires 18 lead from contact surface 17 to contact surfaces 19 on the semiconductor chips 1.

In order to concentrate the radiation emitted by the semiconductor chips 1 in a direction of emission tending away from the carrier 13, the LED 15 comprises a lens body 22 provided with two lens-shaped convexities 21 and covering the semiconductor chips 1.

Figure 4:
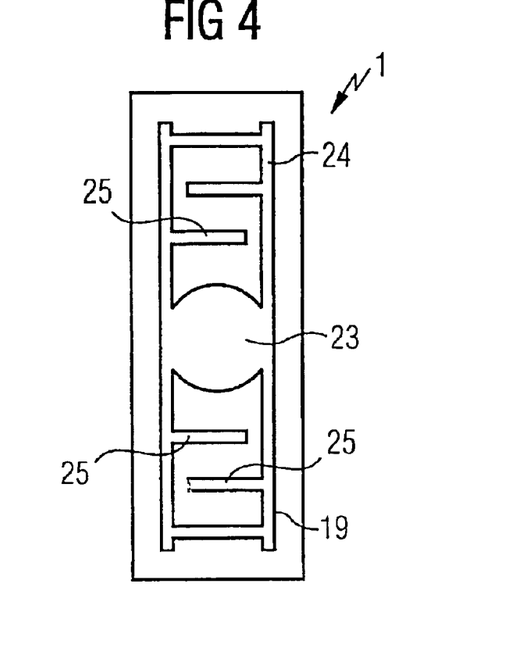
FIG. 4 is a schematic representation of an enlarged plan view of a semiconductor chip provided with a contact layer.

FIG. 4 is an enlarged plan view of one of the semiconductor chips 1 used in LED component 10 or 15. In particular, it shows the detailed structure of contact surface 19. Contact surface 19 comprises a central connection surface 23, for example a bond pad for a wire connection, from which extend branching contact paths 24 comprising stub lines 25. Contact paths 24 are implemented in the manner of a frame along the circumference of semiconductor chip 1. This implementation of contact paths 24 ensures a uniform distribution of current clear across active layer 2. The frame-like implementation of contact paths 24 along the circumference of semiconductor chip 1 also eliminates fluctuations of potential.

Figure 5:
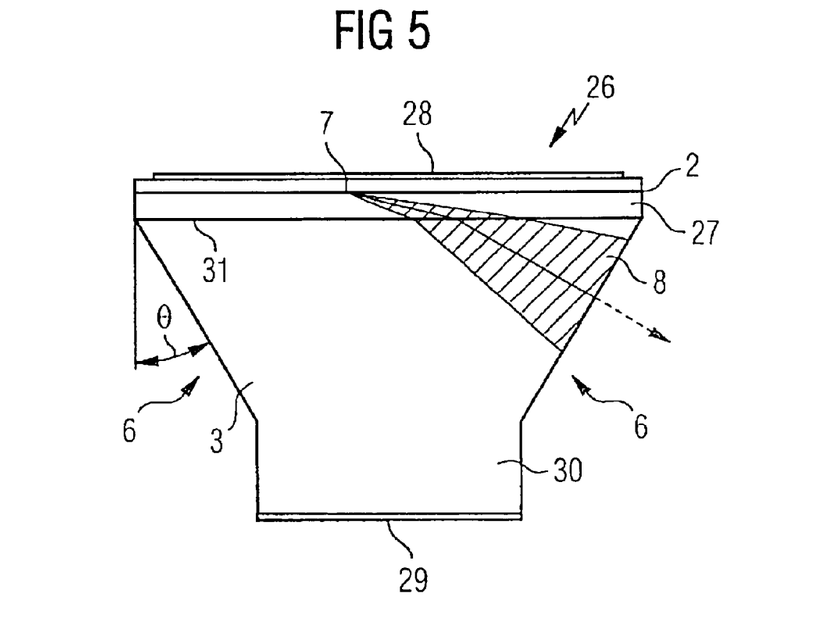
FIG. 5 is a schematic representation of a cross section through a further semiconductor chip.

FIG. 5 is a cross section through a further modified semiconductor chip 26. Here, the semiconductor chip 26 has a multilayer structure 27 that encompasses the active layer 2. The multilayer structure 27 is mounted on a radioparent substrate 3 and is covered on the side facing away from substrate 3 by a top electrode 28. Opposite this electrode 28, the substrate is provided with a bottom electrode 29.

On the side contiguous to multilayer structure 27, substrate 3 comprises inclined lateral surfaces 6 that form an angle of inclination θ with the normal of multilayer structure 27. In the direction of bottom electrode 29, these oblique lateral surfaces give way to lateral surfaces that are arranged perpendicularly to multilayer structure 27 and thus to active layer 2.

In the case of a substrate whose refractive index is greater than the refractive index of the multilayer structure, the angle of inclination θ of the inclined lateral surfaces 6 of the substrate 3 is preferably larger than the critical angle for an interface 31 formed by multilayer structure 27 and substrate 3 (the value of the critical angle is equal to the value of the total reflection angle for a transition from substrate 3 to multilayer structure 27). This shaping substantially increases the solid angle of escape cone 8. As a result, with the semiconductor chip 26 depicted in FIG. 5, the prolongation of the longitudinal sides 6 relative to the transverse sides 9 has an especially advantageous effect.

The multilayer structure can, for example, be a GaN-based semiconductor structure. Semiconductor materials that are especially well suited for this purpose are GaN, AlGaN, InGaN, InAlGaN. Such multilayer structures are usually made by an epitaxial process.

According to the invention, the multilayer structure 27 is preferably grown on a radioparent substrate from which the substrate 3 for the semiconductor chip is also fabricated. Particularly suitable for use as the epitaxial substrate is an SiC substrate, which excels in terms of radioparency and electrical conductivity. In particular, the refractive index of SiC is higher than the refractive index of a GaN-based multilayer structure. Thus, advantageously, there is no total reflection of the radiation produced in the active layer as it enters the substrate.

The region of substrate 3 contiguous to bottom electrode 29 is preferably cubic or cuboid in shape. This shaping, with interfaces that are mutually orthogonal or parallel, simplifies the mounting of the semiconductor chip in this region. This is particularly the case in regard to automatic placement systems, which are designed for the assembly of conventional cuboidally or cubically shaped chips.

Figure 6:
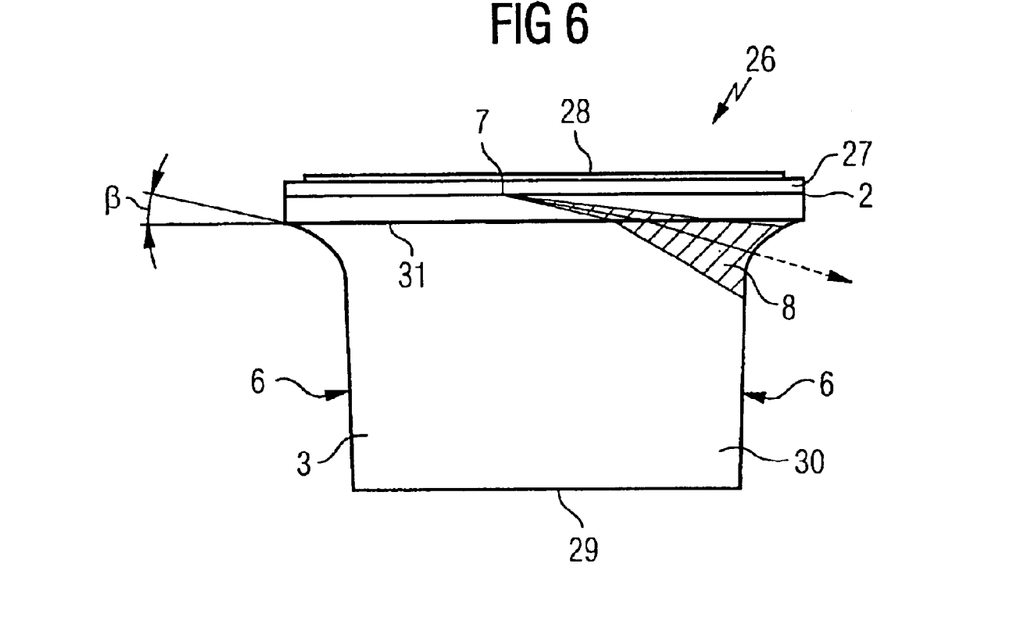
FIG. 6 is a schematic representation of a cross section through a modified semiconductor chip.
Figure 7:
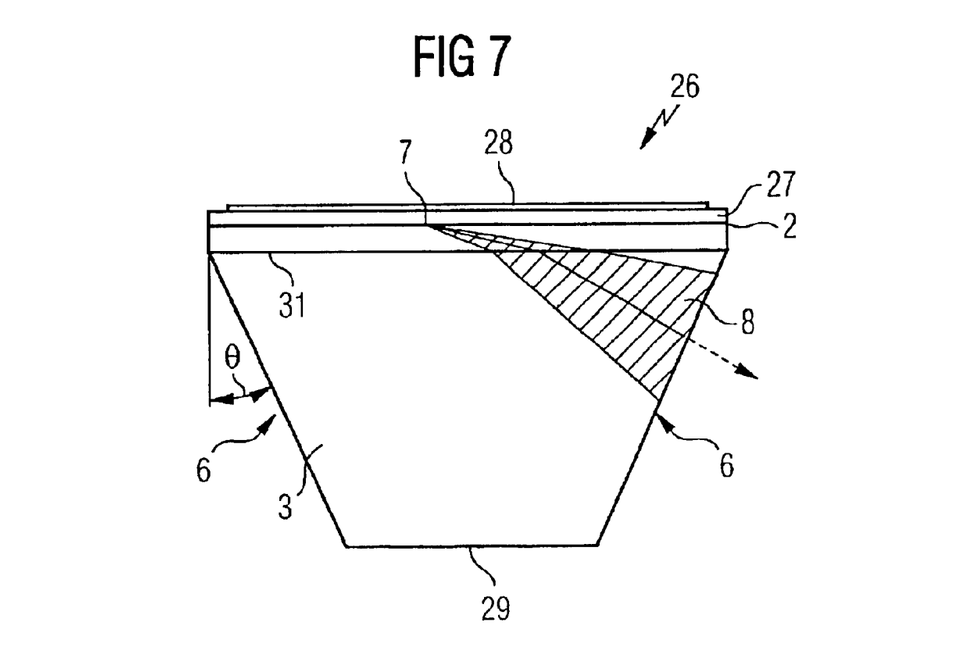
FIG. 7 is a schematic representation of a cross section through a further modified exemplary embodiment of the semiconductor chip.

FIGS. 6 and 7 illustrate further exemplary embodiments of the invention which are also distinguished by high extraction efficiency due to particular shaping of the substrate 3. In the exemplary embodiment shown in FIG. 6, the longitudinal sides of substrate 3 initially form an acute angle β with interface 31. In their subsequent course, the longitudinal sides 6 veer increasingly in the direction of bottom electrode 29. The lateral surfaces 6 are realized as concave and exhibit a smooth transition to a preferably cuboidally or cubically shaped frustum 30.

Finally, in the exemplary embodiment shown in FIG. 7, the formation of a frustum 30 has been abandoned. The substrate 3 tapers over its entire thickness.

It should be noted that it is also theoretically possible to construct the inclined longitudinal sides 6 from mutually offset subsidiary surfaces, in the manner of a Fresnel lens. In this case the rectangular cross sections of the semiconductor chip 1 are preserved, at least in outline.

It should further be noted that the outline of the semiconductor chip 1 or 26 need not necessarily be rectangular. The outline of the semiconductor chip 1 or 26 can also have the shape of a slanted parallelogram, a trapezoid or a polygon.

The increase in light output exhibited by semiconductor chips 1 and 26 in relation to a conventional chip of square outline was determined individually. The following results were obtained:

EXAMPLE 1

An InGaN semiconductor chip has an active area that is to be increased by a factor of 4. The results of the estimate are given in Table 1. The last three columns of the table each give the percentage of extracted radiation referred to the total extraction from the standard chip.

TABLE 1

| Type | Cross-Sectional Area × Height | Current | Front | Lateral surfaces | Total |
|---|---|---|---|---|---|
| Standard chip = reference | 250 × 250 $\mu m^2$ × 250 $\mu m$ | 50 mA | 50% | 50% | 100% |
| Large chip | 750 × 750 $\mu m^2$ × 250 $\mu m$ | 450 mA | 450% | 150% | 600% |
| Rectangular chip | 250 × 2250 $\mu m^2$ × 250 $\mu m$ | 450 mA | 450% | 250% | 700% |

EXAMPLE 2

In the case of the semiconductor chip 26 with inclined sides illustrated in FIG. 5, the following values, presented in Table 2, were found for the various types. The percentage of extracted radiation has been referred to the total extraction obtained with the standard chip, as stated in Table 1.

TABLE 2

| Type | Cross-Sectional Area × Height | Current | Front | Lateral surfaces | Total |
|---|---|---|---|---|---|
| Standard chip = reference | 250 × 250 $\mu m^2$ × 250 $\mu m$ | 50 mA | 50% | 150% | 200% |
| Large chip | 750 × 750 $\mu m^2$ × 250 $\mu m$ | 450 mA | 450% | 400% | 850% |
| Rectangular chip | 250 × 2250 $\mu m^2$ × 250 $\mu m$ | 450 mA | 450% | 1100% | 1550% |

Compared to the large chip of equal area, semiconductor chip 26 of FIG. 5 shows an improvement factor of 1.8, while in the case of semiconductor chip 1 of FIGS. 1a and 1b the gain is roughly 15%. Thus, lengthening the longitudinal sides 6 relative to the transverse sides 9 produces a marked increase in light output.

It should be noted that the considerations presented herein also apply to a semiconductor chip in which the active layer has transverse and longitudinal sides of equal length and in which the substrate has an elongated shape. This is chiefly an option when the active layer itself has sufficiently good thermal conductivity to dissipate the heat losses that occur in the active region, and when the substrate, by contrast, has poor thermal conductivity and therefore needs large cross-sectional areas to be able to dissipate the heat losses.

What is claimes is:

1. A radiation-emitting semiconductor chip comprising an active layer (2) that includes a region emitting electromagnetic radiation, and a substrate (3) which is transparent to the radiation and on which said active layer is arranged, said semiconductor chip having transverse sides (9) and longitudinal sides (6) that delimit it in the directions of extent of said active region and through which at least a portion of the radiation is extracted,
    characterized in that
    at least one longitudinal side (6), serving as the extraction surface, is longer in the direction of extent of said active region than a transverse side (9).
2. The semiconductor chip as recited in claim 1,
    characterized in that
    said semiconductor chip has a multilayer structure (27) that includes said active layer (2) and on which said substrate (3) is arranged.

3. The semiconductor chip as recited in claim 1, characterized in that said longitudinal sides (6) and said transverse sides (9) delimit said active layer (2) in its lateral extent.

4. The semiconductor chip as recited in any of claim 1, characterized in that said longitudinal side (6) serving as the extraction surface is at least twice as long, in the direction of extent of said active layer (2), as a transverse side (9).

5. The semiconductor chip as recited in any of claim 1, characterized in that said longitudinal side (6) serving as the extraction surface has, in the direction of extent of said active layer (2), at least ten times the length of a transverse side (9).

6. The semiconductor chip as recited in any of claim 1, characterized in that said substrate (3) is realized as a parallelepiped.

7. The semiconductor chip as recited in any of claim 1, characterized in that said substrate (3) tapers to a base surface disposed opposite said active layer (2).

8. The semiconductor chip as recited in claim 7, characterized in that said substrate (3) comprises a lateral surface which is inclined with respect to the direction of extent of said active layer (2) and which is disposed after, in the direction of the base surface, a lateral surface that is perpendicular to said direction of extent of said active layer.

9. The semiconductor chip as recited in any of claim 1, characterized in that provided on one of its surfaces are current-spreading lands (24) that originate from a connection surface (23).

10. The semiconductor chip as recited in claim 9, characterized in that stub lines (25) branch off from said current-spreading lands (24).

11. The semiconductor chip as recited in any of claim 2, characterized in that the refractive index of said substrate is greater than the refractive index of said multilayer structure.

12. The semiconductor chip as recited in any of claim 2, characterized in that said multilayer structure contains GaN, InGaN, AlGaN or InAlGaN.

13. The semiconductor chip as recited in claim 1, characterized in that said active layer contains GaN, InGaN, AlGaN or InAlGaN.

14. The semiconductor chip as recited in any of claim 1, characterized in that said substrate is an SiC substrate (3).

15. The semiconductor chip as recited in any of claim 2, characterized in that said multilayer structure (27) is fabricated epitaxially.

16. The semiconductor chip as recited in claim 15, characterized in that the substrate (3) is fabricated from an epitaxial substrate used for the epitaxial fabrication of said multilayer structure (27).

17. A light-emitting diode, characterized in that said light-emitting diode includes a semiconductor chip as recited in any of claim 1.

18. The light-emitting diode as recited in claim 17, characterized in that reflectors (11) extend along the longitudinal sides (6) of said semiconductor chip.

19. The semiconductor chip as recited in claim 2, characterized in that said longitudinal sides (6) and said transverse, sides (9) delimit said active layer (2) in its lateral extent.

20. The semiconductor chip as recited in claim 12, characterized in that said active layer contains GaN. InGaN, AlGaN or InAlGaN.

* * * * *

UNITED STATES PATENT AND TRADEMARK OFFICE
CERTIFICATE OF CORRECTION

PATENT NO.    : 6,891,199 B2
DATED         : May 10, 2005
INVENTOR(S)   : Johannes Baur et al.

It is certified that error appears in the above-identified patent and that said Letters Patent is hereby corrected as shown below:

Title page,
Item [75], Inventors, replace "Johannes Baur, Deuerline (DE)" with -- Johannes Baur, Laaber (DE) --.
Item [56], References Cited, FOREIGN PATENT DOCUMENTS, replace
"EP    59 004088    1/1984" with -- JP    59 004088    11984 --; replace
"EP    62 093985    4/1987" with -- JP    62 093985    4/1987 --; replace
"EP    05 226781    9/1993" with -- JP    05 226781    9/1993 --; replace
"EP    06 224469    8/1994" with -- JP    06 224469    8/1994 --; replace
"EP    08 102549    4/1996" with -- JP    08 102549    4/1996 --; replace
"EP    08 102549    4/1996" with -- JP    08 102549    4/1996 --; replace
"EP    08 288543    11/1996" with -- JP    08 288543    11/1996 --; replace
"EP    11 317546    11/1999" with -- JP    11 317546    11/1999 --.

Signed and Sealed this

Tenth Day of January, 2006

JON W. DUDAS
*Director of the United States Patent and Trademark Office*

UNITED STATES PATENT AND TRADEMARK OFFICE
CERTIFICATE OF CORRECTION

PATENT NO.       : 6,891,199 B2
APPLICATION NO.  : 10/343851
DATED            : May 10, 2005
INVENTOR(S)      : Johannes Baur et al.

It is certified that error appears in the above-identified patent and that said Letters Patent is hereby corrected as shown below:

Column 7
Line 4, after "in" and before "claim" delete "any of"
Line 8, after "in" and before "claim" delete "any of"
Line 13, after "in" and before "claim" delete "any of"
Line 16, after "in" and before "claim" delete "any of"
Line 27, after "in" and before "claim" delete "any of"

Column 8
Line 1, after "in" and before "claim" delete "any of"
Line 4, after "in" and before "claim" delete "any of"
Line 10, after "in" and before "claim" delete "any of"
Line 12, after "in" and before "claim" delete "any of"
Line 21, after "in" and before "claim" delete "any of"
Line 28, between "transverse" and "sides" delete ","
Line 32, after "GaN" replace "." with --,--

Signed and Sealed this

Twenty-ninth Day of August, 2006

JON W. DUDAS
*Director of the United States Patent and Trademark Office*